United States Patent
Lam

(10) Patent No.: US 7,903,359 B1
(45) Date of Patent: *Mar. 8, 2011

(54) ADJUSTMENT OF DIVIDED CLOCK IN DISK HEAD READ CIRCUIT

(75) Inventor: Yat-Tung Lam, Palo Alto, CA (US)

(73) Assignee: Marvell International Ltd., Hamilton (BM)

( * ) Notice: Subject to any disclaimer, the term of this patent is extended or adjusted under 35 U.S.C. 154(b) by 768 days.

This patent is subject to a terminal disclaimer.

(21) Appl. No.: 11/879,487

(22) Filed: Jul. 17, 2007

Related U.S. Application Data

(63) Continuation of application No. 10/035,401, filed on Dec. 28, 2001, now Pat. No. 7,245,446, which is a continuation of application No. 09/660,929, filed on Sep. 13, 2000, now Pat. No. 6,369,967.

(60) Provisional application No. 60/217,612, filed on Jul. 11, 2000.

(51) Int. Cl.
*G11B 5/09* (2006.01)

(52) U.S. Cl. .................... 360/51

(58) Field of Classification Search .......... None
See application file for complete search history.

(56) References Cited

U.S. PATENT DOCUMENTS

| | | | |
|---|---|---|---|
| 5,293,549 A | 3/1994 | Ichikawa | |
| 6,111,712 A * | 8/2000 | Vishakhadatta et al. | 360/51 |
| 6,178,057 B1 | 1/2001 | Kuroda et al. | |
| 6,255,911 B1 | 7/2001 | Niwa et al. | |
| 6,301,066 B1 | 10/2001 | Uno | |
| 6,522,608 B1 * | 2/2003 | Kuroda | 369/47.28 |
| 6,661,754 B2 | 12/2003 | Kuroda | |
| 6,757,228 B2 | 6/2004 | Kuroda | |

* cited by examiner

*Primary Examiner* — Daniell L Negrón

(57) ABSTRACT

A read circuit for providing multi-bit disk data to a disk controller in correspondence to analog data from a disk head, includes a low frequency clock generator whose phase is adjustable in response to a detection of the synchronization marker in the analog disk data. A high frequency clock is phase-locked to the output of the disk head, and synchronizes operation of an A/D converter and a bit detector which produces a verified single-bit based on the A/D output. A serial-to-parallel converter converts the single bit output from the bit detector to a parallel output, and the parallel output is latched to multi-bit disk data for use by the disk controller in accordance with a low frequency clock. The low frequency clock is generated by a clock generator from the high frequency clock with a phase that is adjustable in response to the synchronization mark detector.

23 Claims, 5 Drawing Sheets

ADJUSTMENT OF DIVIDED CLOCK IN DISK HEAD READ CIRCUIT

CROSS-REFERENCE TO RELATED APPLICATIONS

This application is a continuation of U.S. patent application Ser. No. 10/035,401 filed on Dec. 28, 2001, which application is a continuation of application Ser. No. 09/660,929, filed on Sep. 13, 2000 and claims the benefit of U.S. Provisional Application No. 60/217,612, filed on Jul. 11, 2000. The disclosures of the above applications are incorporated herein by reference.

BACKGROUND OF THE INVENTION

1. Field of the Invention

The present invention relates to read circuitry for a disk head, and in particular relates to phase-adjustment of a divided clock in such a read circuit, so as to avoid race conditions between time of data validity and latching of such data in accordance with the divided clock.

2. Description of the Related Art

Read circuits for a disk head provide an interface between a magnetic disk head and a hard disk controller, so as to provide verified digital parallel data to the hard disk controller. Such read circuits include a time base generator phase-locked to the output of the disk head so as to provide a high frequency clock reference, together with a divider to provide a divided clock signal for use in latching digital data. A generalized block diagram for a conventional read circuit, showing the time base generator and the divider, is shown in FIG. 1.

As shown in FIG. 1, read circuit 1 accepts as input the pre-amp output from pre-amp 2 which amplifies the analog output from disk head 3. Read circuit 1 provides 9-bit digital data 4 to hard disk controller 5, which in turn provides the digital data to computer bus 6. Internally, read circuit 1 includes a time base generator 8 phase-locked to the output of pre-amp 2 so as to provide a high frequency clock signal 9. In addition, divider 10 operates to divide the output from time base generator 8 (such as division by 8, 8½, or 9) so as to provide a divided clock signal 11. A/D converter 12 converts the analog output from pre-amp 2 into a digital output such as a 6-bit digital output which is provided to detector 14 (such as a Virterbi detector) which outputs a 1-bit digital signal which is a verified digital bit corresponding to the bit stored on the hard disk. A sequence of such 1-bit digital signals is provided to serial-to-parallel data formatter 15, which converts the 1-bit digital serial data into 9-bit parallel data which includes a parity bit. Each of A/D converter 12, detector 14 and data formatter 15 operate in accordance with high frequency clock 9.

The 9-bit parallel data from data formatter 15, shown at reference numeral 16, is provided to latch 17 which latches the data at a timing determined by divided clock 11. The latched parallel data is thereafter provided to hard disk controller 5, as described before.

FIG. 2 is a timing diagram showing the timing of some signals in the FIG. 1 block diagram. (a) is high frequency clock 9, (b) is the 6-bit output of A/D converter 12, (c) is divided clock 11, and (d) shows validity of 9-bit data 16. As shown in FIG. 2, high frequency clock 9, such as a 600 mHz clock, is divided by divider 10 (in this example, a divide-by-eight divider) into divided clock 11. Superimposed on the waveform for divided clock 11 are count numbers showing the count by which divided clock 11 is created.

Superimposed on A/D converter output 13 is a well-known synchronization marker 20 (hereinafter "SM"), which follows the equally well-known synchronization field. Upon encountering the synchronization marker, digital data from the disk head immediately follows. Digital data here is indicated by numerals 21, also superimposed on the A/D converter output 13, which indicate the bit number of the data. 9-bit data 16 is valid after eight bits of data have been collected from the disk head and the ninth parity bit has been added by formatter 15, as shown in FIG. 2.

Because of the construction of conventional read circuits, it is possible for a race condition to arise between the timing at which data 16 is valid and the timing when latch 17 latches the data in accordance with the rising edge of divided clock 11. This race condition is depicted at 22 in FIG. 2, and arises primarily for two reasons. First, because time base generator 8 is phase-controlled to lock with data from the disk head, its phase moves, causing a corresponding movement in phase of divided clock 11. Second, because the occurrence of the synchronization field and the synchronization marker is asynchronous with operation of divider 11, divider 11 is never exactly certain of where, in the output of high frequency clock 9, 9-bit data 16 will be valid.

SUMMARY OF THE INVENTION

It is an object of the invention to address the foregoing situation, through the provision of a divider whose phase is adjustable in response to detection of the synchronization marker.

In one aspect, the invention is a read circuit which provides multi-bit disk data to a disk controller based on analog data from a disk head. The read circuit includes a high frequency clock, a bit detector synchronized by the high frequency clock to provide single-bit verified digital data corresponding to the analog output of the disk head, a serial-to-parallel data formatter for formatting the single-bit data into parallel data, and a synchronization mark detector for detecting a synchronization mark. The synchronization mark detector can be arranged to detect the synchronization mark based on the single-bit data from the bit detector. A clock generator generates a lower frequency clock from the high frequency clock, such as by dividing the high frequency clock, with the phase of the clock generator being adjustable in response to the synchronization mark detector. A latch operating in response to the adjusted lower frequency clock latches the parallel output from the serial-to-parallel converter, for use by the disk controller.

Preferably, the high frequency clock is phase-locked to the output of the disk head, and further provides synchronization for an A/D converter that provides digital data to the bit detector. In particularly preferred forms, the clock generator, which generates the lower-frequency clock, operates by a reset of a counter which counts the number of pulses from the high frequence clock. The reset is responsive to the synchronization mark detector so as to reset the counter in a situation where a race condition might arise, and so as not to reset the counter in a situation where a race condition surely would not arise.

Because the phase of the clock generator is adjustable in response to a synchronization mark detector, it is possible to adjust the phase such that a race condition with the timing of valid data does not arise.

This brief summary has been provided so that the nature of the invention may be understood quickly. A more complete understanding of the invention can be obtained by reference to the following detailed description of the preferred embodiment thereof in connection with the attached drawings.

DETAILED DESCRIPTION OF THE PREFERRED EMBODIMENT

Figure 3:
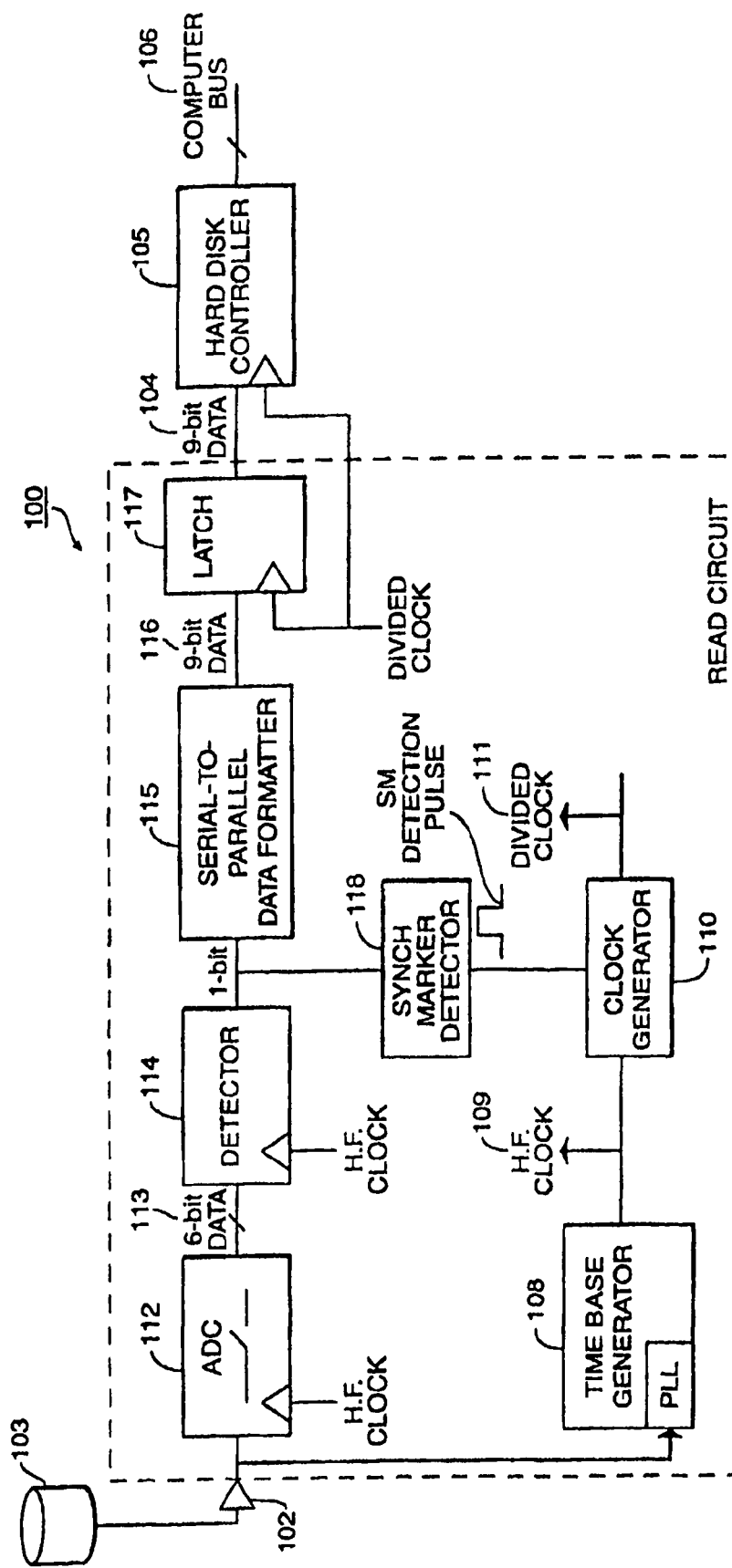
FIG. 3 is a block diagram of a read circuit in accordance with an embodiment of the invention.

FIG. 3 is a block diagram of a representative embodiment of the invention, in which phase of a lower-frequency clock generator is adjusted in accordance with detection of the synchronization marker.

FIG. 3 shows read circuit 100 which accepts analog output from pre-amp 102 whose input is an analog signal from a disk head 103. Read circuit 100 converts the analog signal from pre-amp 102 into 9-bit digital parallel data 104 and provides the 9-bit data 104 to hard disk controller 105 which, in turn, outputs the digital data to computer bus 106.

Internally of read circuit 100, a time base generator 108 phase-locked to the analog output of pre-amp 102 generates high frequency clock 109. A clock generator 110 provides a divided clock output 111, such as division by 8, 8½, or 9, from high frequency clock 109. The phase of divided clock 111 is adjusted in accordance with a detection of the synchronization marker, as described more fully below.

A/D converter 112 converts the analog output from pre-amp 102 into 6-bit data 113 which is provided to single-bit detector 114. Detector 114, which may be a Viterbi detector, generates a verified single-bit output based on the 6-bit data 113, representative of digital data stored on the hard disk. A/D converter 112 and detector 114 operate in synchronism with high frequency clock 109.

A serial-to-parallel data formatter accepts the single-bit output from detector 114 and converts it to parallel 9-bit digital data 116. Data 116 is latched by latch 117 in accordance with the rising edge of divided clock 111 so as to provide 9-bit digital parallel data 104, which is provided to hard disk controller 105 as described before.

Detector 118 detects the synchronization marker in data from the disk head. In this embodiment, detector 118 operates based on the single-bit output from detector 114, so as to provide a SM detection pulse 119. Other arrangements for the detector are possible, such as arrangements in which the synchronization mark is detected based directly on analog data from pre-amp 102 or based on the digital data from A/D converter 112. The SM detection pulse 119 is provided to clock generator 110 so that clock generator 110 can adjust its phase so as to avoid a race condition with validity of 9-bit data 116. This operation is described more fully below in connection with the timing diagram shown in FIG. 4.

Figure 4:
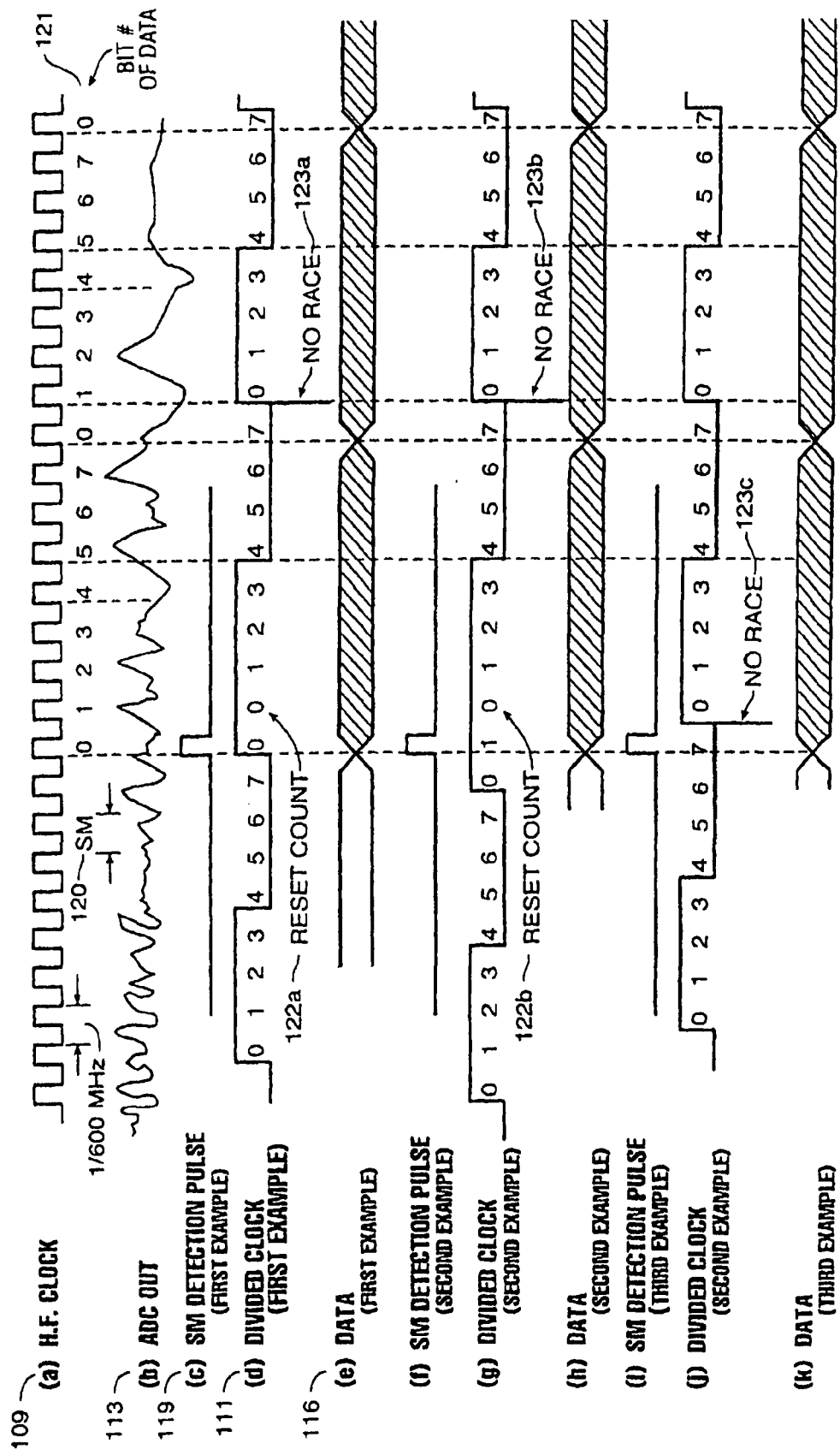
FIG. 4 is a timing diagram showing three different examples of phase adjustment for the block diagram of FIG. 3.

FIG. 4 is a timing diagram showing the timing relationship between some of the signals in the FIG. 3 block diagram. (a) depicts high frequency clock 109 such as a 600 mHz clock, and (b) shows output 113 from A/D converter 112. In a first example of timing, (c) shows SM detection pulse 119 from synchronization marker detector 118, (d) shows divided clock 111 from clock generator 110, and (e) shows 9-bit data 116 from data formatter 115. In a second example of timing, (f), (g) and (h) correspond respectively to SM detection pulse 119, divided clock 111, and data 116; and in a third example of timing (i), (j) and (k) respectively correspond to SM detection pulse 119, divided clock 111 and data 116.

Superimposed over output 113 from A/D converter 112 is synchronization marker 120. Also superimposed over output 113 from A/D converter is the bit number 121 of data contained within the output.

Figure 1:
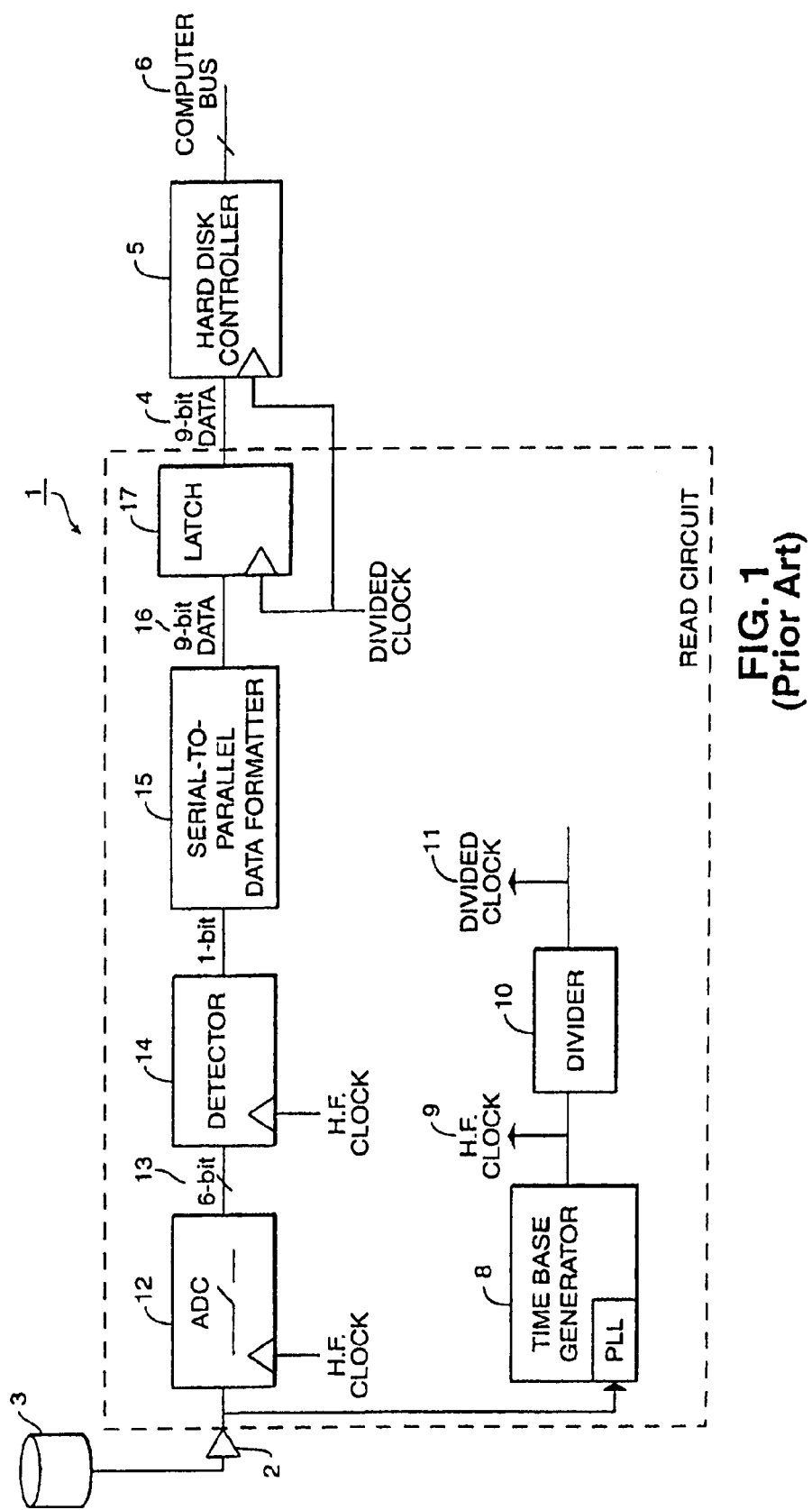
FIG. 1 is a block diagram showing a conventional read circuit.
Figure 2:
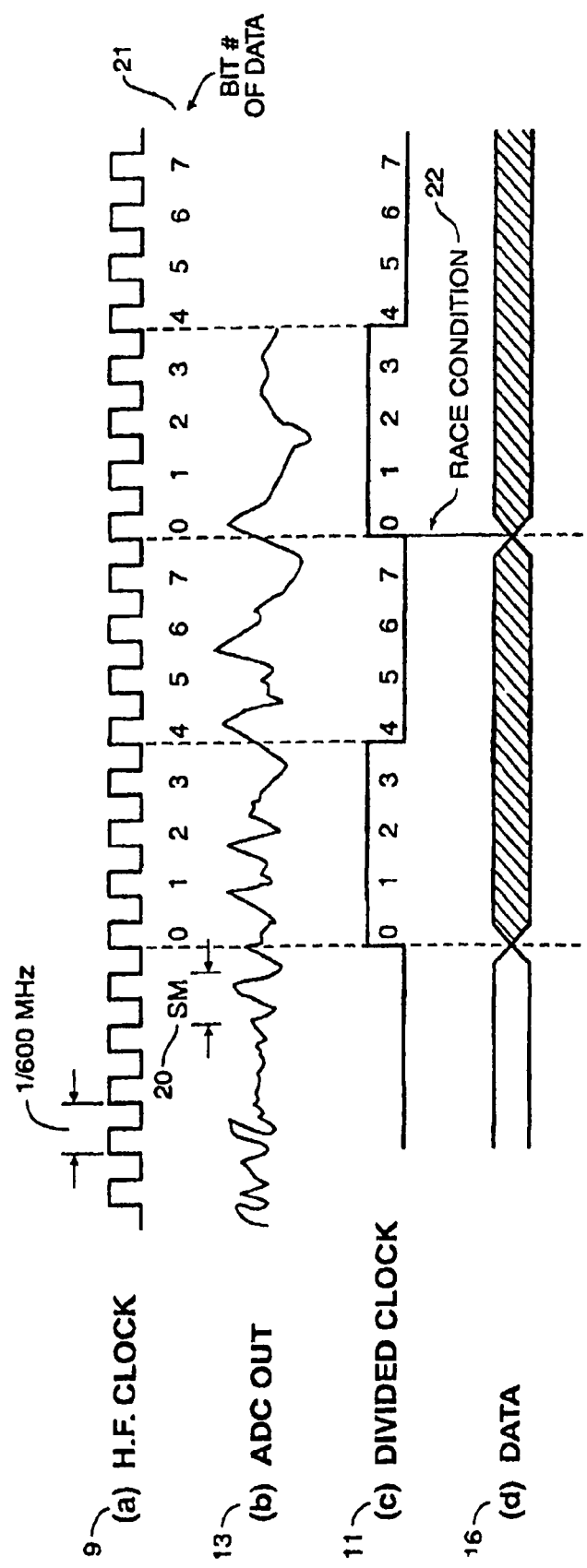
FIG. 2 is a timing diagram for the FIG. 1 block diagram.

Turning to a first example of timing, superimposed on divided clock 111 is a count showing an internal count from clock generator 110 of high frequency clock 109. As shown at (d), the count is identical to that of FIG. 2, and thus would result in a race condition with the timing of validity of data 116. According to the invention, however, phase of the divided clock 111 is adjusted in accordance with the SM detection pulse 119. Specifically, as shown at (d) in FIG. 4, SM detection pulse 119 is generated by synchronization marker detector 118 one cycle after its occurrence at 120. In response to the SM detection pulse, clock generator 110 resets its internal count as shown at 112a. The reset causes the count to begin again, thereby adjusting the phase of divided clock 111 by extending it for one additional clock cycle of high frequency clock 109. As a result of this phase adjustment, data 116 is valid at the rising edge of divided clock 111 resulting in an absence of a race condition, as depicted at 123a.

In this embodiment of the invention, a reset the count is reset any time that SM detection pulse 119 occurs within the first half cycle of divided clock 111, and the count is not reset if the SM detection pulse occurs within the second half cycle of divided clock 111. This is shown in the second example, at (f), (g) and (h). There, SM detection pulse 119 occurs at the second count of high frequency clock 109 in clock generator 110. Accordingly, the internal count is reset as shown at 122b, thereby resulting in the absence of a race condition as shown at 123b.

Because of the reset of the internal count at 122b, the phase of the divided clock is adjusted in accordance with the SM detection pulse so as to avoid a race condition.

In the third example, shown at (i), (j) and (k), no reset occurs because SM detection pulse occurs in the second cycle of divided clock 119. No reset occurs since none is needed to avoid a race condition, as shown at 123c.

Figure 5:
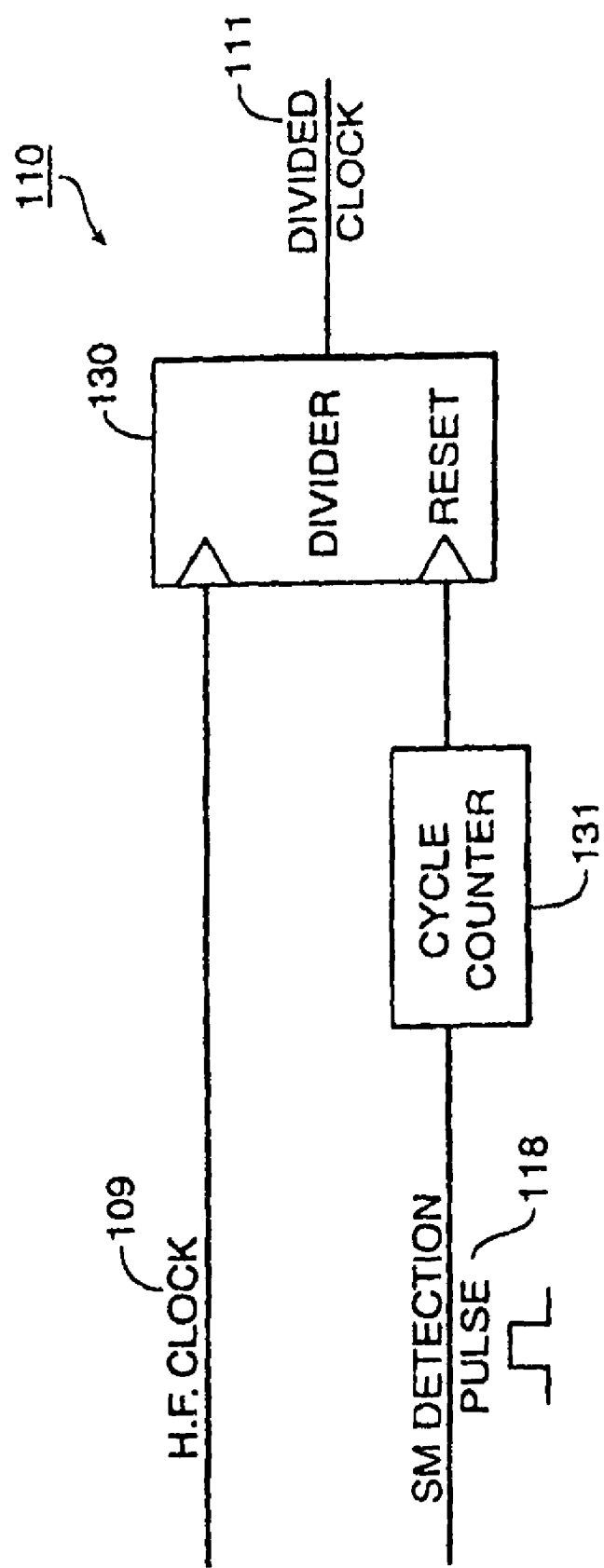
FIG. 5 is a block diagram showing reset circuitry for providing a clock generator whose phase is adjustable in response to a synchronization mark detection.

FIG. 5 is a block diagram showing an internal construction for clock generator 110. As shown in FIG. 5, divider 130 provides divided clock output 111 in accordance with division of a high frequency clock 109. Divider 130 typically divides by 8, 8½ or 9. Divider 130 further includes a reset terminal which resets its division in accordance with the output of cycle counter 131. Cycle counter 131 monitors the current cycle count of high frequency clock 109, so as to determine whether divider 130 is operating in its first half or second half cycle. Upon occurrence of SM detection pulse 118, if cycle counter 131 determines that divider 130 is operating in its first half cycle, it issues a reset pulse so as to adjust the phase of divided clock 111. Conversely, if cycle counter 131 determines that divider 130 is operating in the second half cycle, no reset pulse is issued upon receipt of the SM detection pulse 118.

The invention has been described with respect to particular illustrative embodiments. It is to be understood that the invention is not limited to the above-described embodiments and that various changes and modifications may be made by those of ordinary skill in the art without departing from the spirit and scope of the invention.

What is claimed is:

1. A read circuit comprising:
    a bit detector configured to provide, according to a first clock, single bit digital data corresponding to analog data from a disk head;
    a synchronization mark detector configured to detect a synchronization marker based on the single bit digital data; and
    a clock divider configured to divide the first clock to generate a second clock based on the first clock and ii) the synchronization marker, wherein a frequency of the second clock is less than a frequency of the first clock.

2. The read circuit of claim 1, wherein a phase of the second clock is adjustable in response to the synchronization marker.

3. The read circuit of claim 1, wherein the first clock is phase-locked to an output of the disk head.

4. The read circuit of claim 1, further comprising an analog-to-digital (A/D) converter configured to (i) generate multi-bit digital data based on the analog data and (ii) provide the multi-bit digital data to the bit detector.

5. The read circuit of claim 4, wherein the A/D converter receives the first clock.

6. The read circuit of claim 1, wherein the clock divider is configured to:
    count pulses of the first clock; and
    adjust a phase of the second clock based on the count.

7. The read circuit of claim 6, wherein the clock divider includes:
    a cycle counter configured to generate a reset signal in response to the synchronization mark detector; and
    a divider configured to generate a divided clock based on the first clock and the reset signal.

8. A hard disk drive comprising:
    the read circuit of claim 1;
    a hard disk controller; and
    the disk head.

9. A hard disk drive comprising:
    the read circuit of claim 1;
    a hard disk controller; and
    the disk head.

10. A read circuit comprising:
    bit detector means for providing, according to a first clock, single bit digital data corresponding to analog data from a disk head;
    synchronization mark detector means for detecting a synchronization marker based on the single bit digital data; and
    clock divider means for dividing the first clock to generate a second clock based on i) the first clock and ii) the synchronization marker, wherein a frequency of the second clock is less than a frequency of the first clock.

11. The read circuit of claim 10, wherein a phase of the second clock is adjustable in response to the synchronization marker.

12. The read circuit of claim 10, wherein the first clock is phase-locked to an output of the disk head.

13. The read circuit of claim 10, further comprising an analog-to-digital (A/D) converter means for generating multi-bit digital data based on the analog data, and for providing the multi-bit digital data to the bit detector means.

14. The read circuit of claim 13, wherein the A/D converter means receives the first clock.

15. The read circuit of claim 10, wherein the clock divider means counts pulses of the first clock and adjusts a phase of the second clock based on the count.

16. The read circuit of claim 15, wherein the clock divider includes:
    cycle counter means for generating a reset signal in response to the synchronization mark detector means; and
    divider means for generating a divided clock based on the first clock and the reset signal.

17. A method for operating read circuit, the method comprising:
    in accordance with a first clock, providing single bit digital data corresponding to analog data from a disk head;
    detecting a synchronization marker based on the single bit digital data; and
    using a clock divider to generate a second clock based on i) the first clock and ii) the synchronization marker, wherein a frequency of the second clock is less than a frequency of the first clock.

18. The method of claim 17, wherein a phase of the second clock is adjustable in response to the synchronization marker.

19. The method of claim 17, wherein the first clock is phase-locked to an output of the disk head.

20. The method of claim 17, further comprising:
    generating multi-bit digital data based on the analog data; and
    providing the multi-bit digital data to a bit detector.

21. The method of claim 20, further comprising generating the multi-bit digital data based on the first clock.

22. The method of claim 17, further comprising:
    counting pulses of the first clock; and
    adjusting a phase of the second clock based on the count.

23. The method of claim 22, further comprising:
    generating a reset signal in response to the synchronization marker; and
    generating a divided clock based on the first clock and the reset signal.

* * * * *